(12) United States Patent
Schulz et al.

(10) Patent No.: US 10,749,581 B2
(45) Date of Patent: Aug. 18, 2020

(54) RADIO APPARATUSES FOR LONG-RANGE COMMUNICATION OF RADIO-FREQUENCY INFORMATION

(71) Applicant: Ubiquiti Inc., New York, NY (US)

(72) Inventors: Gary D. Schulz, Cary, IL (US); Paul Odlyzko, Arlington Heights, IL (US); David E. Rawlings, Palatine, IL (US)

(73) Assignee: Ubiquiti Inc., New York, NY (US)

( * ) Notice: Subject to any disclaimer, the term of this patent is extended or adjusted under 35 U.S.C. 154(b) by 0 days.

(21) Appl. No.: 16/361,056

(22) Filed: Mar. 21, 2019

(65) Prior Publication Data

US 2019/0222272 A1 Jul. 18, 2019

Related U.S. Application Data

(62) Division of application No. 15/550,240, filed as application No. PCT/US2016/019050 on Feb. 23, 2016, now Pat. No. 10,284,268.
(Continued)

(51) Int. Cl.
*H04B 7/04* (2017.01)
*H04B 7/0456* (2017.01)
(Continued)

(52) U.S. Cl.
CPC ......... *H04B 7/0456* (2013.01); *H01Q 1/2291* (2013.01); *H04B 1/036* (2013.01);
(Continued)

(58) Field of Classification Search
CPC .......... H04B 7/0456; H04B 7/10; H04B 1/48; H04B 17/318; H04B 1/036; H05K 7/20409; H01Q 1/2291
See application file for complete search history.

(56) References Cited

U.S. PATENT DOCUMENTS

| 3,851,221 A | 11/1974 | Beaulieu et al. |
| 4,087,822 A | 5/1978 | Maybell et al. |

(Continued)

FOREIGN PATENT DOCUMENTS

| CN | 1247641 A | 3/2000 |
| CN | 1527439 A | 9/2004 |

(Continued)

OTHER PUBLICATIONS

U.S. Appl. No. 10/164,332, filed Dec. 25, 2018, Pera et al.
(Continued)

*Primary Examiner* — Kabir A Timory

(74) *Attorney, Agent, or Firm* — Shay Glenn LLP

(57) ABSTRACT

Radio apparatuses and methods for MIMO matrix phasing that may be used to toggle and/or weight the amount of MIMO processing based on the detected level of isolation between different polarizations of the system. Also described herein are apparatuses including auto-range and/or auto-scaling of a signal strength indicator to aid in precise alignment of the apparatus. Any of these apparatuses and methods may also include dynamic power boosting that adjusts the power (e.g., power amplifier) for an RF apparatus based on the data rate. These apparatuses may include a housing enclosing the radio device that includes a plurality of pin elements that may act as heat transfer pins and a ground pin for making a ground connection to the post or pole to which the devices is mounted.

20 Claims, 6 Drawing Sheets

Related U.S. Application Data

(60) Provisional application No. 62/119,771, filed on Feb. 23, 2015.

(51) Int. Cl.

| | | |
|---|---|---|
| *H01Q 1/22* | (2006.01) | |
| *H05K 7/20* | (2006.01) | |
| *H04B 1/036* | (2006.01) | |
| *H04B 17/318* | (2015.01) | |
| *H04B 1/48* | (2006.01) | |
| *H04B 7/10* | (2017.01) | |

(52) U.S. Cl.
CPC .................. *H04B 1/48* (2013.01); *H04B 7/10* (2013.01); *H04B 17/318* (2015.01); *H05K 7/20409* (2013.01)

(56) References Cited

U.S. PATENT DOCUMENTS

| | | | |
|---|---|---|---|
| 4,557,225 A | 12/1985 | Sagues et al. | |
| 4,656,559 A | 4/1987 | Fathi | |
| 5,131,006 A | 7/1992 | Kamerman et al. | |
| 5,151,920 A | 9/1992 | Haagh et al. | |
| 5,295,154 A | 3/1994 | Meier et al. | |
| 5,381,314 A | 1/1995 | Rudy et al. | |
| 5,406,260 A | 4/1995 | Cummings et al. | |
| 5,422,887 A | 6/1995 | Diepstraten et al. | |
| 5,428,636 A | 6/1995 | Meier | |
| 5,504,746 A | 4/1996 | Meier | |
| 5,546,397 A | 8/1996 | Mahany | |
| 5,548,481 A | 8/1996 | Salisbury et al. | |
| 5,596,487 A | 1/1997 | Castaneda et al. | |
| 5,629,713 A | 5/1997 | Mailandt et al. | |
| 5,706,428 A | 1/1998 | Boer et al. | |
| 5,740,366 A | 4/1998 | Mahany et al. | |
| 5,828,339 A | 10/1998 | Patel | |
| 5,844,893 A | 12/1998 | Gollnick et al. | |
| 5,912,646 A | 6/1999 | Seki et al. | |
| 5,930,113 A | 7/1999 | McCann | |
| 5,936,542 A | 8/1999 | Kleinrock et al. | |
| 5,936,588 A | 8/1999 | Rao et al. | |
| 5,940,771 A | 8/1999 | Gollnick et al. | |
| 6,028,769 A | 2/2000 | Zurek | |
| 6,038,129 A | 3/2000 | Falaki et al. | |
| 6,084,772 A | 7/2000 | Pell et al. | |
| 6,130,892 A | 10/2000 | Short et al. | |
| 6,194,992 B1 | 2/2001 | Short et al. | |
| 6,295,028 B1 | 9/2001 | Jonsson et al. | |
| 6,337,990 B1 | 1/2002 | Koshino | |
| 6,374,311 B1 | 4/2002 | Mahany et al. | |
| 6,522,307 B2 | 2/2003 | Kim | |
| 6,563,786 B1 | 5/2003 | Van Nee | |
| 6,636,894 B1 | 10/2003 | Short et al. | |
| 6,643,522 B1 | 11/2003 | Young | |
| 6,665,536 B1 | 12/2003 | Mahany | |
| 6,697,415 B1 | 2/2004 | Mahany | |
| 6,714,559 B1 | 3/2004 | Meier | |
| 6,788,250 B2 | 9/2004 | Howell | |
| 6,789,110 B1 | 9/2004 | Short et al. | |
| 6,795,852 B1 | 9/2004 | Kleinrock et al. | |
| 6,810,426 B2 | 10/2004 | Mysore et al. | |
| 6,813,260 B1 | 11/2004 | Fogle | |
| 6,857,009 B1 | 2/2005 | Ferreria et al. | |
| 6,868,399 B1 | 3/2005 | Short et al. | |
| 7,020,082 B2 | 3/2006 | Bhagavath et al. | |
| 7,038,620 B1 | 5/2006 | Chubb et al. | |
| 7,040,383 B2 | 5/2006 | Oyamada | |
| 7,079,079 B2 | 7/2006 | Jo et al. | |
| 7,088,727 B1 | 8/2006 | Short et al. | |
| 7,117,526 B1 | 10/2006 | Short | |
| 7,136,286 B2 | 11/2006 | Chuang | |
| 7,161,804 B2 | 1/2007 | Oyamada | |
| 7,194,554 B1 | 3/2007 | Short et al. | |
| 7,197,556 B1 | 3/2007 | Short et al. | |
| 7,295,812 B2 | 11/2007 | Haapoja et al. | |
| 7,382,329 B2 | 6/2008 | Kim | |
| 7,386,002 B2 | 6/2008 | Meier | |
| 7,457,646 B2 | 11/2008 | Mahany et al. | |
| 7,477,917 B2 | 1/2009 | Rofougaran et al. | |
| 7,532,908 B2 | 5/2009 | Rofougaran et al. | |
| 7,593,230 B2 | 9/2009 | Abul-Haj et al. | |
| 7,633,757 B2 | 12/2009 | Gustine et al. | |
| 7,643,794 B2 | 1/2010 | Ofek et al. | |
| D618,630 S | 6/2010 | Wei et al. | |
| 7,739,383 B1 | 6/2010 | Short et al. | |
| 7,752,334 B2 | 7/2010 | Paunikar et al. | |
| 7,764,504 B2 | 7/2010 | Phillips et al. | |
| D621,796 S | 8/2010 | Hu et al. | |
| D622,230 S | 8/2010 | Yan et al. | |
| 7,826,426 B1 | 11/2010 | Bharghavan et al. | |
| 7,889,701 B2 | 2/2011 | Malik et al. | |
| 7,924,564 B1 | 4/2011 | Wilson | |
| 8,077,113 B2 | 12/2011 | Syed et al. | |
| 8,184,064 B2 | 5/2012 | Sanford | |
| 8,190,708 B1 | 5/2012 | Short et al. | |
| 8,335,272 B2 | 12/2012 | Roberts | |
| 8,483,188 B2 | 7/2013 | Walton et al. | |
| 8,498,574 B2 | 7/2013 | Beninghaus et al. | |
| 8,604,989 B1 | 12/2013 | Olsen | |
| 8,724,605 B2 | 5/2014 | Zhang et al. | |
| 8,736,503 B2 | 5/2014 | Zaghloul et al. | |
| 8,836,601 B2 | 9/2014 | Sanford et al. | |
| 8,977,733 B1 | 3/2015 | Phuong et al. | |
| 9,106,495 B2 | 8/2015 | Kim et al. | |
| 9,293,817 B2 | 3/2016 | Sanford | |
| 9,368,870 B2 | 6/2016 | Dayanandan et al. | |
| 9,715,609 B1 | 7/2017 | Fink et al. | |
| 9,761,954 B2 | 9/2017 | Keniuk et al. | |
| 9,807,905 B2 | 10/2017 | Sporer et al. | |
| 9,843,096 B2 | 12/2017 | Sanford | |
| 9,912,053 B2 | 3/2018 | Sanford et al. | |
| 10,069,580 B2 | 9/2018 | Hardy et al. | |
| 10,084,238 B2 | 9/2018 | Keniuk et al. | |
| 10,284,268 B2 | 5/2019 | Schulz et al. | |
| 2002/0101388 A1 | 8/2002 | Ippolito | |
| 2002/0126062 A1 | 9/2002 | Matthews | |
| 2002/0138443 A1 | 9/2002 | Schran et al. | |
| 2002/0193945 A1 | 12/2002 | Tan et al. | |
| 2003/0052830 A1 | 3/2003 | Ogawa et al. | |
| 2003/0128684 A1 | 7/2003 | Hirsh et al. | |
| 2004/0027816 A1 | 2/2004 | Ice | |
| 2004/0033817 A1 | 2/2004 | Gorsuch et al. | |
| 2004/0203528 A1 | 10/2004 | Ammar et al. | |
| 2005/0075070 A1 | 4/2005 | Crilly | |
| 2005/0285803 A1 | 12/2005 | Iacono et al. | |
| 2006/0020978 A1 | 1/2006 | Miyagawa | |
| 2006/0114839 A1 | 6/2006 | Meier et al. | |
| 2006/0203789 A1 | 9/2006 | Iacono et al. | |
| 2006/0209876 A1 | 9/2006 | Liu et al. | |
| 2006/0268760 A1 | 11/2006 | Fang et al. | |
| 2007/0001918 A1 | 1/2007 | Ebling et al. | |
| 2007/0058336 A1 | 3/2007 | Cheng et al. | |
| 2007/0182657 A1 | 8/2007 | Chiang et al. | |
| 2007/0285327 A1 | 12/2007 | Paschen et al. | |
| 2009/0264148 A1 | 10/2009 | Tom | |
| 2009/0286569 A1 | 11/2009 | Rousu et al. | |
| 2009/0312044 A1 | 12/2009 | Hottinen | |
| 2010/0014502 A1 | 1/2010 | Singh et al. | |
| 2010/0060531 A1 | 3/2010 | Rappaport | |
| 2010/0073260 A1 | 3/2010 | Fujita | |
| 2010/0238846 A1 | 9/2010 | Xu et al. | |
| 2010/0271985 A1 | 10/2010 | Gabriel et al. | |
| 2010/0283707 A1 | 11/2010 | Foo | |
| 2011/0063182 A1 | 3/2011 | Sanford | |
| 2011/0064033 A1 | 3/2011 | Gong et al. | |
| 2011/0116230 A1 | 5/2011 | Kwak et al. | |
| 2012/0077504 A1 | 3/2012 | Schadler et al. | |
| 2012/0106070 A1 | 5/2012 | Landon | |
| 2012/0276949 A1 | 11/2012 | Dorsey et al. | |
| 2013/0031201 A1 | 1/2013 | Kagan et al. | |
| 2013/0072243 A1 | 3/2013 | Yu et al. | |
| 2013/0072247 A1 | 3/2013 | Park et al. | |
| 2013/0099895 A1 | 4/2013 | Harpak et al. | |

(56) References Cited

U.S. PATENT DOCUMENTS

| | | |
|---|---|---|
| 2013/0115887 A1 | 5/2013 | Kwon et al. |
| 2013/0272263 A1 | 10/2013 | Pi et al. |
| 2013/0322495 A1 | 12/2013 | Behdad et al. |
| 2014/0218255 A1 | 8/2014 | Sanford et al. |
| 2014/0226698 A1* | 8/2014 | Negus .............. H04B 7/0486 375/211 |
| 2015/0188267 A1 | 7/2015 | Choi et al. |
| 2015/0201429 A1 | 7/2015 | Chen et al. |
| 2016/0105203 A1 | 4/2016 | Rilling |
| 2016/0261030 A1 | 9/2016 | Kim et al. |
| 2016/0261326 A1* | 9/2016 | Barker .............. H04B 7/0617 |
| 2018/0261916 A1 | 9/2018 | Sanford et al. |
| 2019/0044248 A1 | 2/2019 | Keniuk et al. |
| 2019/0131702 A1 | 5/2019 | Pera et al. |

FOREIGN PATENT DOCUMENTS

| | | |
|---|---|---|
| CN | 103812538 A | 5/2014 |
| CN | 203760677 U | 8/2014 |
| DE | 102012023938 A1 | 12/2014 |
| EP | 0886336 B1 | 10/2003 |
| JP | 10-303808 A | 11/1998 |
| WO | WO98/40990 A1 | 9/1998 |
| WO | WO01/31855 A2 | 5/2001 |
| WO | WO01/31886 A2 | 5/2001 |
| WO | WO01/86877 A2 | 11/2001 |
| WO | WO2006/084331 A1 | 8/2006 |
| WO | WO2007/069809 A1 | 6/2007 |
| WO | WO2008/042804 A2 | 4/2008 |
| WO | WO2011/005710 A2 | 1/2011 |
| WO | WO2014/191756 A1 | 12/2014 |

OTHER PUBLICATIONS

Keniuk et al.; U.S. Appl. No. 16/452,332 entitled "Synchronized multiple-radio antenna systems and methods," filed Jun. 25, 2019.

\* cited by examiner $$P_{RX} = P_{TX} G_{TX} G_{RX} \left(\frac{\lambda}{4\pi r}\right)^2$$

- $P_{RX}$: received power
- $P_{TX}$: transmit power
- $G_{TX} G_{RX}$: gain of transmit and receive antennas
- $\lambda$: wavelength
- $r$: separation distance

RADIO APPARATUSES FOR LONG-RANGE COMMUNICATION OF RADIO-FREQUENCY INFORMATION

CROSS REFERENCE TO RELATED APPLICATIONS

This patent application is a divisional of U.S. patent application Ser. No. 15/550,240, titled "RADIO APPARATUSES FOR LONG-RANGE COMMUNICATION OF RADIO-FREQUENCY INFORMATION", filed on Aug. 10, 2017; which is a U.S. National Phase Application Under 35 U.S.C. § 371 of International Application No. PCT/US2016/019050, titled "RADIO APPARATUSES FOR LONG-RANGE COMMUNICATION OF RADIO-FREQUENCY INFORMATION", filed on Feb. 23, 2016; which claims priority to U.S. provisional patent application No. 62/119,771, titled "RADIO APPARATUSES FOR LONG-RANGE COMMUNICATION OF RADIO-FREQUENCY INFORMATION," filed on Feb. 23, 2015; each of which is incorporated by reference herein in its entirety.

INCORPORATION BY REFERENCE

All publications and patent applications mentioned in this specification are herein incorporated by reference in their entirety to the same extent as if each individual publication or patent application was specifically and individually indicated to be incorporated by reference.

FIELD

This disclosure is generally related to wireless communication systems. More specifically, this disclosure is related to radio apparatuses (devices and systems) for high-speed, long-range wireless communication, and particularly radio devices for point-to-point transmission of high bandwidth signals.

BACKGROUND

The rapid development of optical fibers, which permit transmission over longer distances and at higher bandwidths, has revolutionized the telecommunications industry and has played a major role in the advent of the information age. However, there are limitations to the application of optical fibers. Because laying optical fibers in the field can require a large initial investment, it is not cost effective to extend the reach of optical fibers to sparsely populated areas, such as rural regions or other remote, hard-to-reach areas. Moreover, in many scenarios where a business may want to establish point-to-point links among multiple locations, it may not be economically feasible to lay new fibers.

On the other hand, wireless radio communication devices and systems provide high-speed data transmission over an air interface, making it an attractive technology for providing network connections to areas that are not yet reached by fibers or cables. However, currently available wireless technologies for long-range, point-to-point connections encounter many problems, such as limited range and poor signal quality.

Radio frequency (RF) and microwave antennas represent a class of electronic antennas designed to operate on signals in the megahertz to gigahertz frequency ranges. Conventionally these frequency ranges are used by most broadcast radio, television, and wireless communication (cell phones, Wi-Fi, etc.) systems with higher frequencies often employing parabolic antennas.

Conventional radio devices, including radio devices having parabolic reflectors, suffer from a variety of problems, including difficulty in aligning with an appropriate receiver, monitoring and switching between transmitting and receiving functions, avoiding interference (including reflections and spillover from adjacent radios/antennas), and complying with regulatory requirements without negatively impacting function.

Described herein are devices, methods and systems that may address many of the issues identified above.

SUMMARY OF THE DISCLOSURE

Described herein are apparatuses (including systems and devices) including radios that may operate as MIMO devices. In particular, described herein are radio frequency (RF) radio devices that are configured to be more efficient than prior art devices. For example, described herein are apparatuses and methods for MIMO matrix phasing that may be used to toggle and/or weight the amount of MIMO processing based on the detected level of isolation between different polarizations of the system.

Also described herein are apparatuses including auto-range and/or auto-scaling of a signal strength indicator to aid in precise alignment of the apparatus.

Any of these apparatuses and methods may also include dynamic power boosting that adjusts the power (e.g., power amplifier) for an RF apparatus based on the data rate (e.g., BPSK, 16QAM, 64QAM, 256QAM, etc.) being used, in order to keep the amplifier operating with linear ranges even across different data rates, to prevent signal distortion.

Any of these apparatuses described herein may be configured so that the housing enclosing the radio device (which may be mounted to or integrated into a dish or other antenna component for mounting on a post or pole) including a plurality of pin elements that may act as heat transfer pins; one or more of these pins may be configured to act as a ground pin for making a ground connection to the post or pole to which the devices is mounted.

Other features of methods and apparatuses are described and illustrated herein, and any of these features may be incorporated together with any of the other features or elements described herein.

BRIEF DESCRIPTION OF THE DRAWINGS

The novel features of the invention are set forth with particularity in the claims that follow. A better understanding of the features and advantages of the present invention will be obtained by reference to the following detailed description that sets forth illustrative embodiments, in which the principles of the invention are utilized, and the accompanying drawings of which:

DETAILED DESCRIPTION

Figures 1, 2:
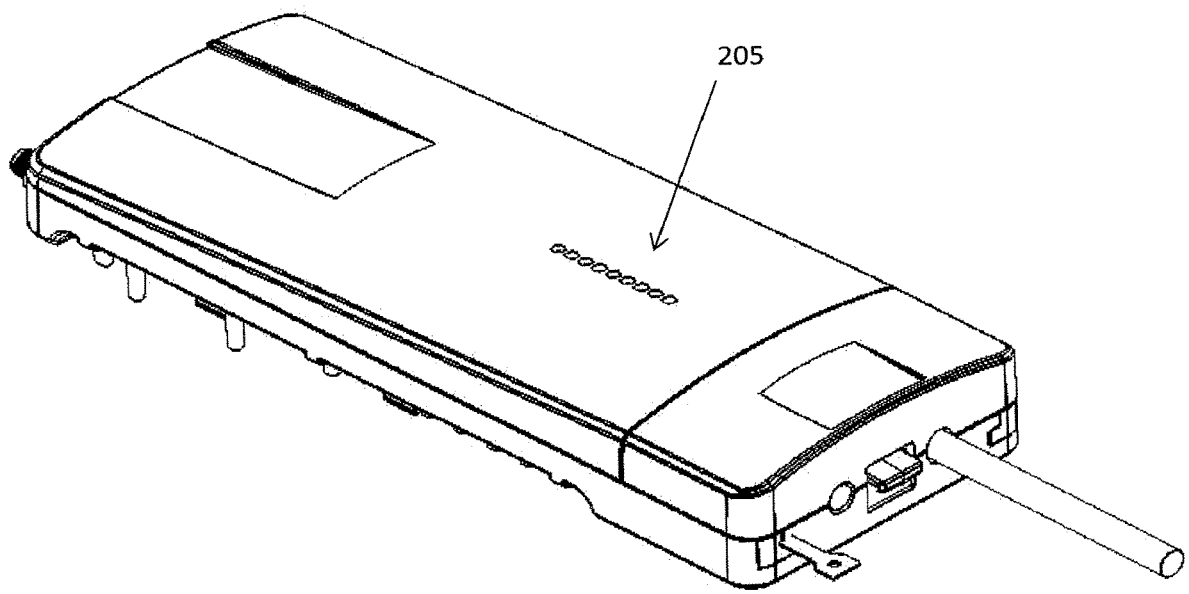
FIG. 1 is one example a calculated optimal received power of an apparatus as described herein (e.g., using the Friis equation).
FIG. 2 is a perspective (isometric) view of the front of one variation of a radio apparatus as described herein, showing the front outer housing, including "bar" indicators (205) on the housing that may be used for alignment.
Figure 3:
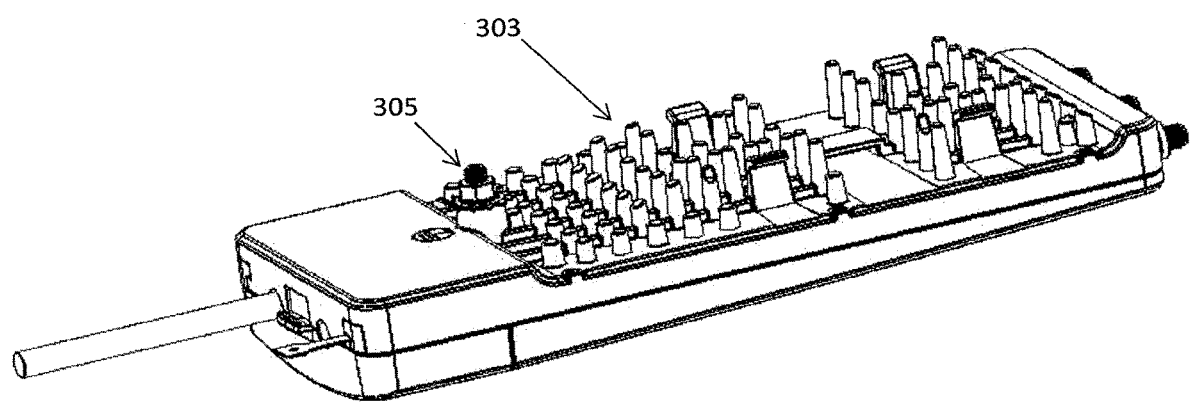
FIG. 3 is a back perspective (isometric) view of the apparatus of FIG. 2, showing the pins (303) for heat transfer as well as a ground pin (305).
Figure 4:
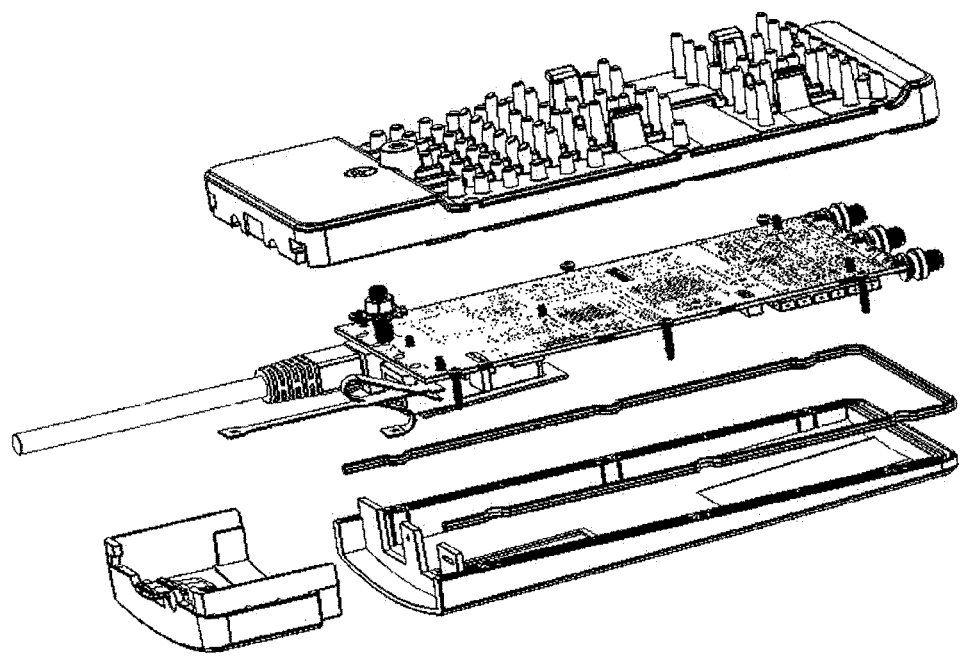
FIG. 4 is an exploded view of the apparatus of FIG. 2.
Figure 5:
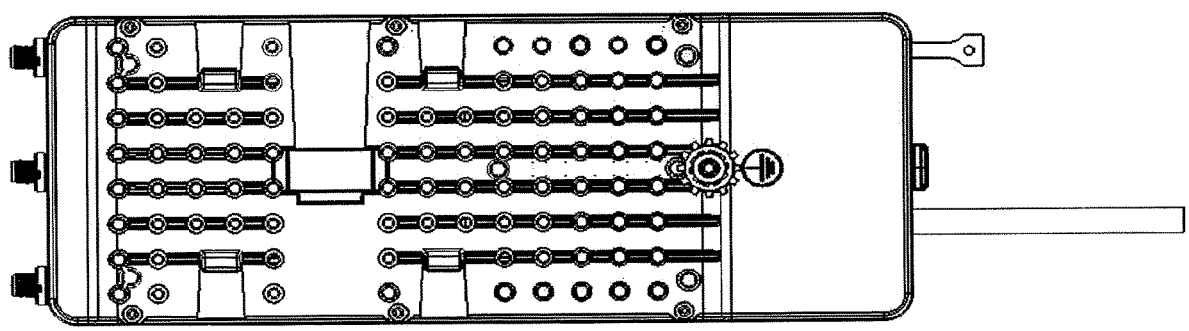
FIG. 5 is a back view of the apparatus of FIG. 2.
Figure 6:
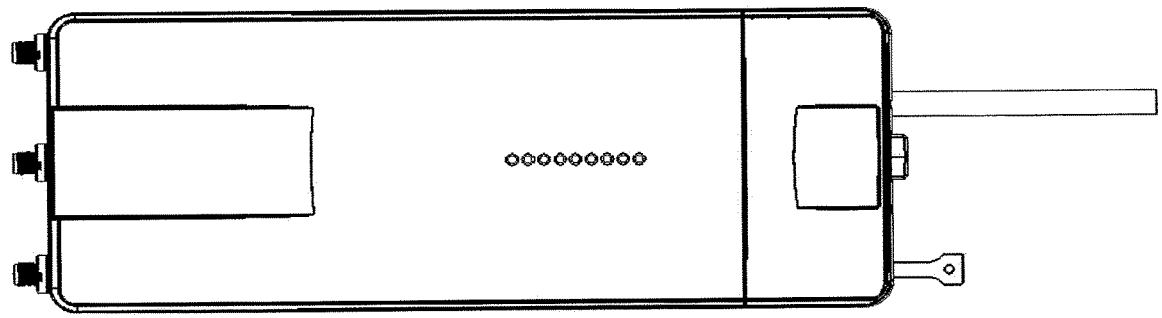
FIG. 6 is a front view of the apparatus of FIG. 2.
Figure 7:
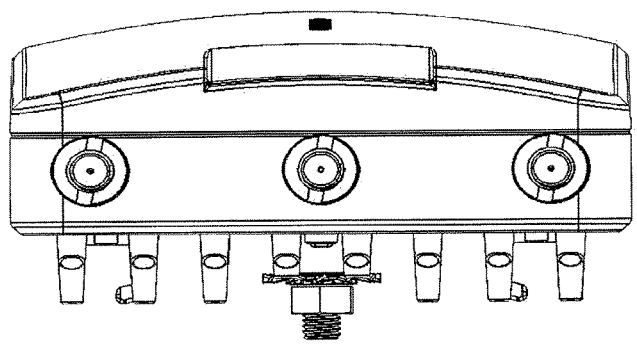
FIG. 7 is a bottom view of the apparatus of FIG. 2.
Figure 8:
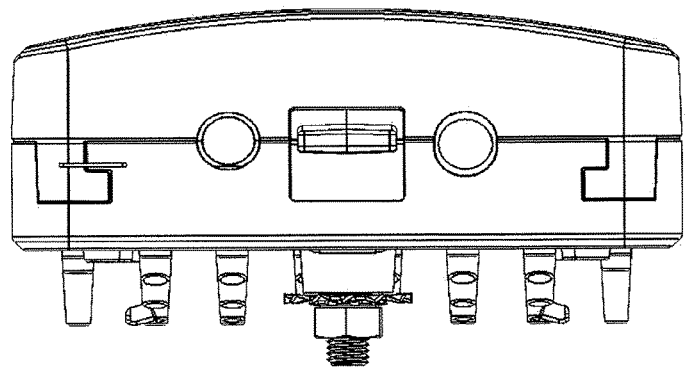
FIG. 8 is a top view of the apparatus of FIG. 2.
Figure 9:
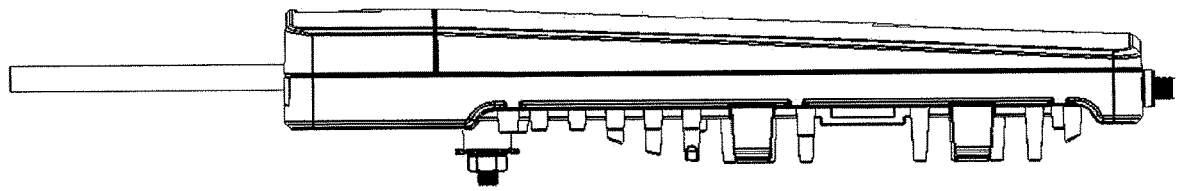
FIG. 9 is a right side view of the apparatus of FIG. 2.
Figure 10:
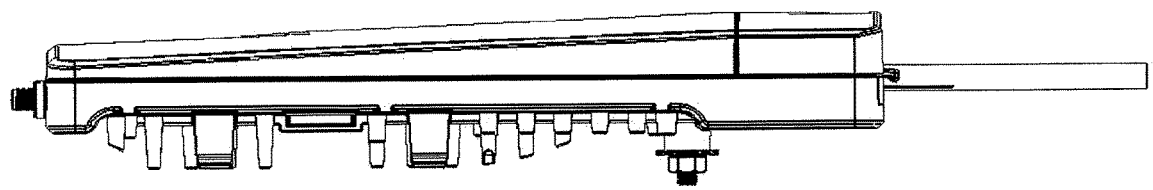
FIG. 10 is a left side view of the apparatus of FIG. 2.

Described herein are radio systems, including radio frequency (RF) systems that may be used with one or more antenna devices for long-range communication of RF information between one or more devices.
MIMO Matrix Phasing For example described herein are RF devices (radio devices) that may be configured as multiple-input multiple-output (MIMO) systems that adjust the MIMO matrix phasing based on the level of isolation between differently polarized signals. In principle, MIMO matrix phasing or may be used to weight the amount of MIMO processing based on the detected level of isolation between different polarizations of the system. Thus, in high isolation environments, in which the different polarizations (e.g., distinct orthogonal polarizations) are highly isolated, the apparatus may reduce or stop MIMO processing, e.g., cross-coupling of the MIMO processing intended to improve the signal to noise ratio (SNR) of the signal. In effect, this may scale or remove cross polarization.

MIMO matrix phasing may toggle or scale received signals based on the isolation between the differently polarized signals. Conventional MIMO matrix processing typically seeks to decontaminate received signals by using reference signals (e.g., pilots or pilot signals). Reference signals are generated by each different transmit chain (polarization) for a given pilot subcarrier. Received values from different received chains may then be used to construct an inverted channel matrix to separate the signals transmitted by the different polarizations from signals transmitted in the other polarizations. However, this technique, while particularly effective in environments having multiple transmission paths, may be time- and resource intensive even when signals are otherwise well isolated, resulting in an unexpected penalty in SNR for the overall link. Although this tradeoff may be acceptable in many situations, particularly in those in which "normal" MIMO processing is useful, in situations in which the isolation between the different transmission chains is high you may instead get a substantial performance benefit by not performing this typical matrix processing. Instead, by detecting and responding to the degree of isolation between different polarizations, the apparatuses and methods described herein may either scale the degree of MIMO processing, e.g., by a matrix phaser, or in some variations turning the processing on/off. Thus, in some variations, when the polarizations are well-separated, the apparatus or method may adapt to allow a higher speed, high-isolation form of processing of the two (or more) chains that are isolated, which in some instances also greatly improves the signal strength; since the signals do not have to be de-scrambled, resulting in up to 4 dB or greater improvement. Conceptually, this is similar to putting a low weight on other polarizations in the MIMO signal processing. In situations where there are few reflecting, scattering, or absorbing objects in the transmission path between the transmitter and the receiver, the signal arrives "generally" clean so that the polarizations are independent of each other; in this case, the use of the standard matrix processing (e.g., use of a 2×2 matrix) actually contaminates the signal, and invokes unnecessary processing expense. Thus, the methods and apparatuses described herein scale between or select the amount of matrix processing. As mentioned, if there is high isolation b/w the two or more polarizations used, then instead of using standard matrix inversion (which, in this case would degrade the quality of transmission) the apparatus may completely skip the matrix processing or scale the amount of matrix processing based on the degree of isolation. Thus, the amount of processing may vary depending on the amount of isolation.

In general, the method and apparatus may be adapted to continuously or periodically determine the degree of isolation of the different polarizations used to transmit signal. The degree of polarization may be determined by comparing test signals (e.g., reference signals), and identifying how well isolated the signals are. For example, a transmitter may be configured to transmit reference signals in defined subcarriers that are received by a receiver. The processing described herein is typically (but may not be exclusively) performed in the receiver. Reference signals generated by the transmitter in different subcarriers may be received by a receiver having two or more receive chains; if the separation between the subcarriers (polarizations) is high (or perfect) the orthogonal receive chain sees only noise, which the receiver can detect and quantify. By comparing the noise, you can find out if the two chains are well isolated and/or who well isolated the chains are. The receiver (e.g., radio chip) may be configured to perform this processing. This can be dynamically (e.g., could be done symbol by symbol), or periodically (e.g., every n signals or n seconds or fractions of a second), at the receiver. Thus, it can be performed very quickly and efficiently. Further, this method may not require any additional exchange of information with the transmitter, but may be autonomously performed by the receiver. Alternatively, the transmitter may receive information about the degree of isolation and may respond by increasing/decreasing the frequency of transmission of reference signals. For example, reference signals may be transmitted periodically by the transmitter and received by the receiver; in case of perfect isolation (or a high degree of isolation), the rate and/or number of pilot signals (reference signals) may be decreased.

As mentioned above, the apparatus or method may determine whether or not to apply matrix processing (or how to weight the applied processing) based on the degree of isolation of each polarized signal used. For example, in some variations a threshold may be applied to determine whether to apply matrix processing, e.g., if the degree of isolation is, e.g., 30 dB or greater, the method or apparatus may use non-matrix processing, otherwise matrix processing may be applied. Alternatively or additionally, in some variations the system may scale the matrix processing applied based on the degree of isolation, as discussed above, e.g., to provide proportional correction. If the matrix correction (signal processing) is used, the SNR degradation may also be proportional.

As mentioned, the degree of isolation of differently polarized signals may be used by the receiver to apply MIMO matrix phasing; in some variations, this information may be feed back to the transmitter which may adjust transmission (including the rate of transmission of reference signals, or the encoding scheme), which may also feedback to the receiver and effect the MIMO matrix phasing. For example, in situations in which the one or more receivers communicating with a transmitter indicate that the isolation between differently polarized signals is high, the transmitter may adjust the data rate to a higher data rate, such as BPSK, 16QAM, 64QAM, 256QAM, etc.). The greater the isolation, the higher the data rate that may be used. The data rate may also effect the isolation and overall signal quality, which may be continuously and/or dynamically adjusted. In most MIMO systems, the receiver using multiple polarizations typically uses an invert matrix for every subcarrier, which can be complex and may consume processing power. The apparatus may consider how much signal to noise you have in one chain versus another, and then correctly align the signals based on their polarizations. Decoding of signal in one chain may be influenced by the noise from the other chain. In contrast, in the apparatuses and methods implementing MIMO matrix phasing described herein, when differently polarized signals are well isolated, orthogonal polarizations may be essentially ignored, avoiding the possible introduction of additional noise. Each receive chain may ignore the orthogonal polarization.

This implementation is particularly effective in the context of outdoor systems (which may have low multipath environments) and systems in which there is a highly synchronized transmission/reception model (including GPS synchronization), which may allow precise tracking of carrier frequencies and control of the timing between transmitters and receivers.

Figure 11A:
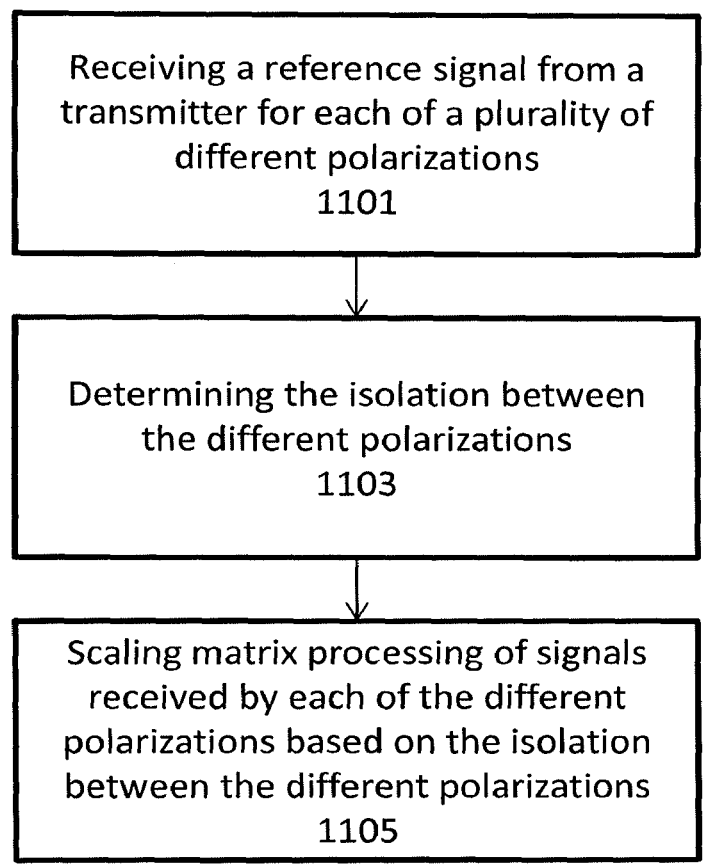
FIG. 11A is one example of a method of multiple-input, multiple-output (MIMO) matrix phasing of a radio apparatus.
Figure 11B:
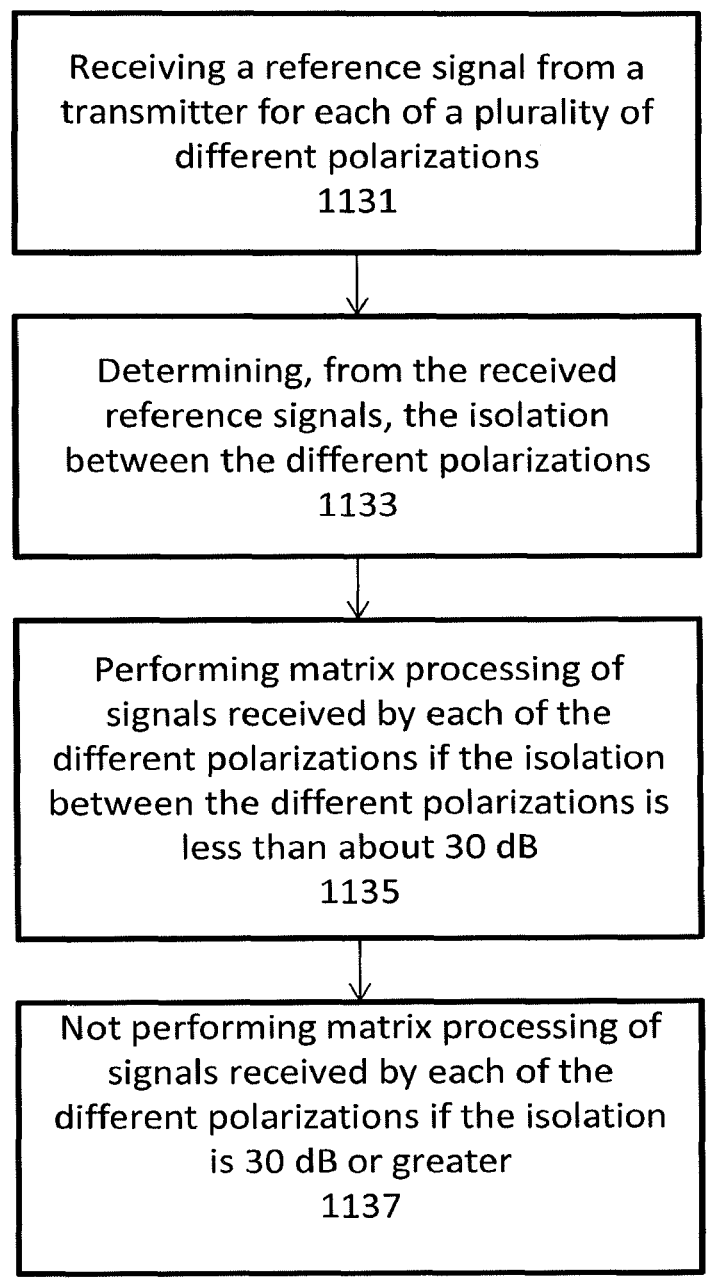
FIG. 11B is another example of a method of multiple-input, multiple-output (MIMO) matrix phasing of a radio apparatus.

FIGS. 11A and 11B illustrate methods of multiple-input, multiple-output (MIMO) matrix phasing of a radio apparatus as described above.

Auto-Range and Auto-Scaling Signal Strength Indicator

Any of the apparatuses and methods described herein may also include auto-range and/or auto-scaling of a signal strength indicator to aid in precise alignment of the apparatus. For example, an apparatus may be configured to determine and display range and signal strength indicators on the apparatus (e.g., on an outer surface of a device or system) and/or on mobile or other computer device. In particular a signal strength indicator may be auto scaled so that it can be meaningfully and quickly used by an installer in positioning and/or adjusting the position of an apparatus.

In general, any of the apparatuses described herein may calculate one or more strength indicators as soon as a link (e.g., master and slave link) is established, e.g., during the initial message exchange. The signal strength indicator may be derived using a separation distance between the two endpoints, and may be used to help calculate what the transmission timing should be (e.g., where in the frame) including how to line up the subscribers, etc. Typically, the systems described herein may have a highly accurate measure of how far apart the two endpoints are (using, e.g., GPS data, which may also be used for timing coordination), and the apparatus may use the frequency as well as information based on the power setting to make a link budget calculation (dynamic) that is based on antenna gain, power, etc. This derived value may be automatically scaled (e.g., automatically scaling the signal strength indicator) so it may be shown at full scale. Presentation of this information may allow the user to easily aim and adjust the receiver (and/or transmitter).

For example, the antenna gain (which may be known based on the hardware of the receiver and/or transmitter) may be used along with the position and frequency information. Derived gain and power for the apparatus may be compared to a calculated "ideal" value and used to optimize the positioning. For example, received gain may be used to perform a received signal strength power measurement based on actual recovered data and used to graphically represent the dB below power compared to an ideal signal strength power, so that positioning can be adjusted (manually or automatically) to drive the difference between the two as close to zero as possible. In some variations either the actual and/or calculated value may be displayed as discrete indicators, such as "bars" (e.g., LEDs) on the apparatus. See, e.g., FIG. 2. For example, an installer can just look at the bars to optimize the positioning. Broadly, this may be referred to as a radio signal strength indicator (RSSI).

Thus, the radio signal strength indicator (RSSI) presentation on or in the apparatus may be used as an aid in aiming of the antennas during installation. For example, given the length of the RF link (r), wavelength ($\lambda$), antenna gain of the transmitter antenna ($G_{TX}$), gain of the receive antenna ($G_{RX}$) and the transmit power ($P_{TX}$), the received power ($P_{RX}$) may be calculated. For example, the well-known Friis formula may be used to derive calculated received power (see, e.g., FIG. 1).

The received power ($P_{RX}$) may be calculated from the formula as an ideal (e.g., best obtainable result) value. The separation distance value for the apparatus receiving the power (e.g., at the end of the link) may be obtained during a registration process, as it the initial coarse aiming of these radios typically allows the exchange of as few basic control messages. The gains of the antennas: $G_{RX}$ for one end and $G_{RX}$ for the other, as well as $G_{TX}$ for one and $G_{TX}$ for the other, are typically known to the devices integrated with antennas; for example, the accurate gains may be entered by the installers. The radios may exchange their radio parameters (transmit power and antenna gains) so that each may calculate the maximum obtainable receive power. The results of the calculation may be different for the two ends, depending on the gain of each receive antennas—these may differ, as well as the transmit power of each radio.

The maximum values may be used for the numeric and graphical displays on the device (e.g., on a web page), as well as on indicators (typically LED's) on the devices, in such a way that the maximum bar indication corresponds to the maximum obtainable value. Thus it is a relative indication, rather than a representation of the actual received power. This way the installer may get an immediate feedback on the optimality of the orientation of the antenna.

To present complete information of the link and the optimality of the installation these indicators are exchanged between the ends of the link and presented at both ends.

Dynamic Power Boost

Any of the apparatuses and methods described herein may include a dynamic power boosting that adjusts the power for the apparatus based on the data rate (e.g., BPSK, 16QAM, 64QAM, 256QAM, etc.). For example, a transmitter with a power amplifier having specific characteristics may be controlled by the power booster so that it continues to operate in a linear range even as the apparatus adjusts (including dynamically adjusts) the data rate based on one or more specific parameters, as described above. For example, if the apparatus is using a higher-order constellation data rate (e.g., 256QAM), there may be higher demand on the power for the system, putting a greater demand on the power amplifier, because the distance between points in the constellation are much smaller, so there is a lower effective tolerance for distorting the signal trajectory. In some variations the apparatus may establish a map where the linear operating range for the particular power amplifier in the apparatus is known.

When the apparatus is driven to farther ranges (e.g., when the SNR goes down, permitting higher constellation values), power demands may be adjusted; when error rates go up, the radio apparatus may drop to lower constellation data rates, which in turn drives the power amp demands. In general, as the apparatus goes to lower constellations, there may be an increase on the demand on amplifier. Thus any of these apparatuses may be configured so that the power amplification is adjusted to remain in a linear range of operation as the data rate is modified. Adjusting to the non-linearities of the power amplifier over this potentially broad range of operations may allow operation with minimal distortion.

Heat Management and Mounting

FIGS. 2-10 illustrate one variation of the housing of the apparatuses described herein, including the use of a plurality of heat transfer "pins" that may be of particular use in radio apparatuses that are mounted for external operation over a variety of outdoor environments. Although the device may include a large heat sink, the sink may be connected to a plurality of arranged pins (also referred to as pin-type fins) that permit sufficient airflow while transferring heat and aiding also aiding in mounting the device.

In general, the use of these pins may allow cooling both in the presence of a horizontal wind (or breeze) and in conditions of otherwise low air flow. For example, the pins may be arranged (as shown in FIGS. 2-10) to maximize the turbulence of airflow over the outside of the radio apparatus, so that cooling is not just convective. These pins also operate well in conditions (e.g., behind a big dish antenna) where the radio apparatus is otherwise shielded from wind and other elements that may aid in cooling the apparatus.

The configuration of the apparatus housing and, in particular, the arrangement of the pins shown, are particularly well suited to provide a reaction surface for controlling thermal regulation (cooling) and for allowing mounting.

For example, the arrangement of pins on the back of the apparatus shown may define both turbulent cooling channels, and appropriate mounting regions. The use of additional pins down close to the surface may serve the dual purpose of providing material flow allowing cooling and thermal transfer, particularly in relation to the internal position of the power amplifier, which may generate a majority of heat in the apparatus, as well as providing an end plane (back plane) to conduct energy down to a lower position, and to accommodate a mount.

For example, when the apparatus is attached to a pole or post, the housing configuration, including the pins, may also be configured to assist in grounding (electrically grounding) the apparatus. For example, the apparatus may be ground by attachment to a ground stud on the back surface. This configuration may allow the apparatus to be operated without the need for a separate ground connection; instead, when connected (e.g., strapped) to a pole or post, the ground pin may ground it to the pole/post.

In general, at least the back portion of the housing is die case (e.g., aluminum). There may be regions on the back that are free of pins; in some variations the internal power amplifier may be located off of the upper region (e.g., under the first region of pins at the upper and top of the back). The thermal pins shown typically have a height of about 15 mm from the back; this height has been determined to be a maximum effective height for pins of this dimension. Longer pins do not have any additional appreciable heat transfer. This height is also sufficient to allow connection between the ground pin and the post when mounted/fastened to a post or pole. Some of the pins may be smaller heights; FIGS. 2-10 illustrate a variety of pin heights, showing an outer envelope for the pins with a tapered profile; the tapering may follow the profile in a board within the inside of the device.

They apparatuses described herein are generally configured so that the radio maximum power conditions result in about a 21-22 degrees rise above ambient temperature, which may generally insure that the internal temperature of the apparatus does not exceed 80° C. This may define the number and length of the pins.

When a feature or element is herein referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments. It will also be appreciated by those of skill in the art that references to a structure or feature that is disposed "adjacent" another feature may have portions that overlap or underlie the adjacent feature.

Terminology used herein is for the purpose of describing particular embodiments only and is not intended to be limiting of the invention. For example, as used herein, the singular forms "a", "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. As used herein, the term "and/or" includes any and all combinations of one or more of the associated listed items and may be abbreviated as "/".

Spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if a device in the figures is inverted, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly. Similarly, the terms "upwardly", "downwardly", "vertical", "horizontal" and the like are used herein for the purpose of explanation only unless specifically indicated otherwise.

Although the terms "first" and "second" may be used herein to describe various features/elements (including steps), these features/elements should not be limited by these terms, unless the context indicates otherwise. These terms may be used to distinguish one feature/element from another feature/element. Thus, a first feature/element discussed below could be termed a second feature/element, and similarly, a second feature/element discussed below could be termed a first feature/element without departing from the teachings of the present invention.

As used herein in the specification and claims, including as used in the examples and unless otherwise expressly specified, all numbers may be read as if prefaced by the word "about" or "approximately," even if the term does not expressly appear. The phrase "about" or "approximately" may be used when describing magnitude and/or position to indicate that the value and/or position described is within a reasonable expected range of values and/or positions. For example, a numeric value may have a value that is +/−0.1% of the stated value (or range of values), +/−1% of the stated value (or range of values), +/−2% of the stated value (or range of values), +/−5% of the stated value (or range of values), +/−10% of the stated value (or range of values), etc. Any numerical range recited herein is intended to include all sub-ranges subsumed therein.

Although various illustrative embodiments are described above, any of a number of changes may be made to various embodiments without departing from the scope of the invention as described by the claims. For example, the order in which various described method steps are performed may often be changed in alternative embodiments, and in other alternative embodiments one or more method steps may be skipped altogether. Optional features of various device and system embodiments may be included in some embodiments and not in others. Therefore, the foregoing description is provided primarily for exemplary purposes and should not be interpreted to limit the scope of the invention as it is set forth in the claims.

The examples and illustrations included herein show, by way of illustration and not of limitation, specific embodiments in which the subject matter may be practiced. As mentioned, other embodiments may be utilized and derived there from, such that structural and logical substitutions and changes may be made without departing from the scope of this disclosure. Such embodiments of the inventive subject matter may be referred to herein individually or collectively by the term "invention" merely for convenience and without intending to voluntarily limit the scope of this application to any single invention or inventive concept, if more than one is, in fact, disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

What is claimed is:

1. A method of multiple-input, multiple-output (MIMO) matrix phasing of a radio apparatus, the method comprising:
   receiving a reference signal from a transmitter in the radio apparatus for each of a plurality of different polarizations;
   determining, from the received reference signal, an isolation between the plurality of different polarizations; and
   scaling matrix processing of signals received by each of the plurality of different polarizations based on the isolation between the plurality of different polarizations.

2. The method of claim 1, wherein receiving the reference signals comprises receiving a horizontal and vertical polarization reference signal.

3. The method of claim 1, wherein determining comprises measuring a degree of isolation by comparing the reference signals.

4. The method of claim 1, wherein scaling comprises determining a scalar for the matrix processing that is proportional to a degree of isolation between the plurality of different polarizations.

5. The method of claim 1, wherein scaling comprises not performing matrix processing of signals received by each of the plurality of different polarizations when a degree of isolation is 30 dB or greater.

6. The method of claim 1, wherein scaling comprises removing cross polarization processing of the signals.

7. The method of claim 1, further comprising turning the processing of the signals off or on based on the isolation between the plurality of different polarizations.

8. The method of claim 1, further comprising turning the processing of the signals off or on based on the isolation between the plurality of different polarizations.

9. The method of claim 1, wherein a degree of isolation of the plurality of different polarizations are continuously determined.

10. The method of claim 1, wherein a degree of isolation of the plurality of different polarizations are periodically determined.

11. The method of claim 1, wherein the reference signals are received by a receiver having two or more receiving chains.

12. A method of multiple-input, multiple-output (MIMO) matrix phasing of a radio apparatus, the method comprising:
   receiving a reference signal from a transmitter in the radio apparatus for each of a plurality of different polarizations;
   determining, from the received reference signals, an isolation between the plurality of different polarizations; and
   performing matrix processing of signals received by each of the plurality of different polarizations if the isolation between the plurality of different polarizations is less than about 30 dB and not performing matrix processing of signals received by each of the plurality of different polarizations if the isolation is 30 dB or greater.

13. The method of claim 12, wherein the reference signals are received by a receiver having two or more receiving chains.

14. The method of claim 12, wherein receiving the reference signals comprises receiving a horizontal and vertical polarization reference signal.

15. The method of claim 12, wherein determining comprises measuring a degree of isolation by comparing the reference signals.

16. The method of claim 12, wherein scaling comprises determining a scalar for the matrix processing that is proportional to a degree of isolation between the plurality of different polarizations.

17. The method of claim 12, further comprising auto-scaling a signal strength indicator to aid in alignment of the radio apparatus.

18. The method of claim 12, wherein a degree of isolation of the plurality of different polarizations are continuously determined.

19. The method of claim 12, wherein a degree of isolation of the plurality of different polarizations are periodically determined.

20. The method of claim 12, further comprising transmitting to the transmitter information related to the determined isolation between the plurality of different polarizations.

\* \* \* \* \*